(12) United States Patent
Chang et al.

(10) Patent No.: US 12,033,868 B2
(45) Date of Patent: *Jul. 9, 2024

(54) ELECTRONIC PACKAGE AND METHOD FOR FABRICATING THE SAME

(71) Applicant: Siliconware Precision Industries Co., Ltd., Taichung (TW)

(72) Inventors: Shu-Chi Chang, Taichung (TW); Wei-Ping Wang, Taichung (TW); Hsien-Lung Hsiao, Taichung (TW); Kaun-I Cheng, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/343,544

(22) Filed: Jun. 28, 2023

(65) Prior Publication Data

US 2023/0343603 A1  Oct. 26, 2023

Related U.S. Application Data

(60) Continuation of application No. 17/123,630, filed on Dec. 16, 2020, now Pat. No. 11,728,178, which is a
(Continued)

(30) Foreign Application Priority Data

Mar. 30, 2017   (TW) ................................ 106110778

(51) Int. Cl.
*H01L 21/44* (2006.01)
*H01L 21/56* (2006.01)
(Continued)

(52) U.S. Cl.
CPC .......... *H01L 21/44* (2013.01); *H01L 23/3114* (2013.01); *H01L 23/485* (2013.01);
(Continued)

(58) Field of Classification Search
CPC ....... H01L 21/44; H01L 21/561; H01L 21/50; H01L 21/56; H01L 23/3114;
(Continued)

(56) References Cited

U.S. PATENT DOCUMENTS 7,327,015 B2   2/2008  Yang et al.
7,790,500 B2 *  9/2010  Ramos .................... H01L 24/48
                                                              257/676
(Continued)

*Primary Examiner* — Dale E Page
*Assistant Examiner* — Quovaunda Jefferson
(74) *Attorney, Agent, or Firm* — Studebaker & Brackett PC

(57) ABSTRACT

An electronic package and a method for fabrication the same are provided. The method includes: disposing an electronic component on a substrate; forming an encapsulant layer on the substrate to encapsulate the electronic component; and forming a shielding layer made of metal on the encapsulant layer. The shielding layer has an extending portion extending to a lateral side of the substrate along a corner of the encapsulant layer, without extending to a lower side of the substrate. Therefore, the present disclosure prevents the shielding layer from coming into contact with conductive pads disposed on the lower side of the substrate and thereby avoids a short circuit from occurrence.

5 Claims, 4 Drawing Sheets

Related U.S. Application Data division of application No. 15/628,416, filed on Jun. 20, 2017, now Pat. No. 10,903,088.

(51) Int. Cl.
| | | |
|---|---|---|
| *H01L 23/00* | (2006.01) | |
| *H01L 23/31* | (2006.01) | |
| *H01L 23/485* | (2006.01) | |
| *H01L 23/552* | (2006.01) | |
| *H01L 27/06* | (2006.01) | |
| *H01L 29/78* | (2006.01) | |

(52) U.S. Cl.
CPC ............ *H01L 23/552* (2013.01); *H01L 24/12* (2013.01); *H01L 27/0623* (2013.01); *H01L 29/7834* (2013.01); *H01L 21/561* (2013.01); *H01L 23/3121* (2013.01); *H01L 24/16* (2013.01); *H01L 24/48* (2013.01); *H01L 2224/16227* (2013.01); *H01L 2224/48227* (2013.01); *H01L 2224/97* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
CPC . H01L 23/485; H01L 23/552; H01L 23/3121; H01L 23/31; H01L 24/12; H01L 24/16; H01L 24/48; H01L 27/0623; H01L 29/7834; H01L 2224/16227; H01L 2224/48227; H01L 2224/97; H01L 2924/15313; H01L 2924/19041; H01L 2924/19042; H01L 2924/19043; H01L 2924/19105; H01L 2924/3025; H01L 2224/85; H01L 2224/81

See application file for complete search history.

(56) References Cited

U.S. PATENT DOCUMENTS

| | | | |
|---|---|---|---|
| 8,736,030 B2* | 5/2014 | Yao | ............... H01L 21/561 |
| | | | 257/659 |
| 11,728,178 B2* | 8/2023 | Chang | ............... H01L 23/485 |
| | | | 438/126 |
| 2009/0302437 A1 | 12/2009 | Kim et al. | |
| 2014/0231972 A1 | 8/2014 | Hsu et al. | |
| 2015/0155240 A1 | 6/2015 | Yao et al. | |

\* cited by examiner

ELECTRONIC PACKAGE AND METHOD FOR FABRICATING THE SAME

This is a continuation of U.S. patent application Ser. No. 17/123,630, filed on Dec. 16, 2020, which is a divisional of U.S. patent application Ser. No. 15/628,416, filed on Jun. 20, 2017, which claims foreign priority under 35 U.S.C. § 119(a) to Taiwan Application No. 106110778, filed on Mar. 30, 2017, the entire contents of all of which are incorporated herein by reference for all purposes.

BACKGROUND

1. Technical Field

The present disclosure relates to semiconductor packaging technologies. More particularly, the present disclosure relates to a semiconductor package immune from electromagnetic interference and a method for fabricating the same.

2. Related Art

Along with the progress of semiconductor technologies, various package types have been developed for semiconductor devices. To improve electrical performance, a lot of semiconductor products are provided with a shielding function so as to prevent electromagnetic interference (EMI) from occurrence.

FIG. 1 is a schematic cross-sectional view of a conventional RF module 1 having an EMI shielding function. Referring to FIG. 1, a plurality of electronic components 11 such as RF and non-RF chips are disposed on and electrically connected to a substrate 10, and an encapsulant layer 13 made of an epoxy resin is formed on the substrate 10 and encapsulates the electronic components 11. Further, a metal layer 15 is formed on an upper surface 13a and a side surface 13c of the encapsulant layer 13 and a side surface 10c of the substrate 10 by sputtering. The metal layer 15 is electrically connected to a grounding structure 100 on the side surface 10c of the substrate 10 so as to be further electrically connected to a system ground, thus protecting the electronic components 11 from being adversely affected by external EMI.

In addition, a plurality of conductive pads 101 are generally formed on a lower surface of the substrate 10 for mounting balls. Since the conductive pads 101 positioned around an outer periphery of the lower surface of the substrate 10 is very close to edges of the substrate 10, during the sputtering process, the metal layer 15 easily overflows to the lower surface of the substrate 10 and comes into contact with the conductive pads 101, thus resulting in a short circuit.

Therefore, there is a need to provide an electronic package and a method for fabricating the same so as to overcome the above-described drawbacks.

SUMMARY

In view of the above-described drawbacks, the present disclosure provides an electronic package, which comprises: a substrate having a first side, a second side opposite to the first side, and a lateral side adjacent to the first side and the second side; an electronic component disposed on the first side of the substrate and electrically connected to the substrate; an encapsulant layer formed on the first side of the substrate, encapsulating the electronic component, and having a first surface bonded to the first side of the substrate, a second surface opposite to the first surface, and a side surface adjacent to the first surface and the second surface; and a shielding layer formed on the second surface of the encapsulant layer and having an extending portion extending from a portion of an edge of the second surface of the encapsulant layer to the lateral side of the substrate along the side surface of the encapsulant layer, the extending portion being free from extending to the second side of the substrate, with a portion of the side surface of the encapsulant layer and a portion of the lateral side of the substrate exposed from the shielding layer.

The present disclosure further provides a method for fabricating an electronic package, which comprises: providing a substrate has a first side, a second side opposite to the first side, and a lateral side adjacent to the first side and the second side; disposing at least one electronic component on the first side of the substrate, and electrically connecting the electronic component to the substrate; forming on the substrate an encapsulant layer encapsulating the electronic component and having a first surface bonded to the first side of the substrate, a second surface opposite to the first surface, and a side surface adjacent to the first surface and the second surface; and forming on the second surface of the encapsulant layer a shielding layer having an extending portion extending from a portion of an edge of the second surface of the encapsulant layer to the lateral side of the substrate along the side surface of the encapsulant layer, the extending portion being free from extending to the second side of the substrate, with a portion of the side surface of the encapsulant layer and a portion of the lateral side of the substrate exposed from the shielding layer.

In an embodiment, the shielding layer is formed by: providing a carrier having a plurality of substrates and a plurality of isolating portions formed between the substrates; disposing a plurality of electronic components on the substrates, with the encapsulant layer encapsulating the electronic components; forming in the encapsulant layer a plurality of through holes extending to the lateral sides of the substrates and corresponding in position to the isolating portions at corners of the substrates; forming the shielding layer on the second surface of the encapsulant layer, with the shielding layer extending into the through holes to form the extending portions; and performing a singulation process along the isolating portions to separate the substrates from one another.

In an embodiment, the substrate has a plurality of conductive pads exposed from the second side of the substrate.

In an embodiment, the substrate has a grounding portion in contact with the shielding layer. In another embodiment, the grounding portion communicates with the lateral side of the substrate and is in contact with the extending portion of the shielding layer.

In an embodiment, the encapsulant layer is made of an insulating material.

In an embodiment, the shielding layer is made of a conductive material.

In an embodiment, the extending portion extends from a corner of the second surface of the encapsulant layer toward a corner of the second side of the substrate.

According to the present disclosure, the extending portion of the shielding layer extends from a portion of an edge of the second surface of the encapsulant layer to the lateral side of the substrate along the side surface of the encapsulant layer, the extending portion being free from extending to the second side of the substrate, with a portion of the side surface of the encapsulant layer and a portion of the lateral side of the substrate exposed from the shielding layer. As such, the present disclosure prevents the extending portion from coming into contact with the conductive pads of the substrate, thereby effectively avoiding a short circuit from occurrence.

BRIEF DESCRIPTION OF DRAWINGS

FIGS. 2A' and 2B' are schematic upper views of FIGS. 2A and 2B, respectively; and FIG. 2D' is a schematic enlarged perspective view of FIG. 2D.

DETAILED DESCRIPTION

The following illustrative embodiments are provided to illustrate the present disclosure; these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "upper", "lower", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 1:
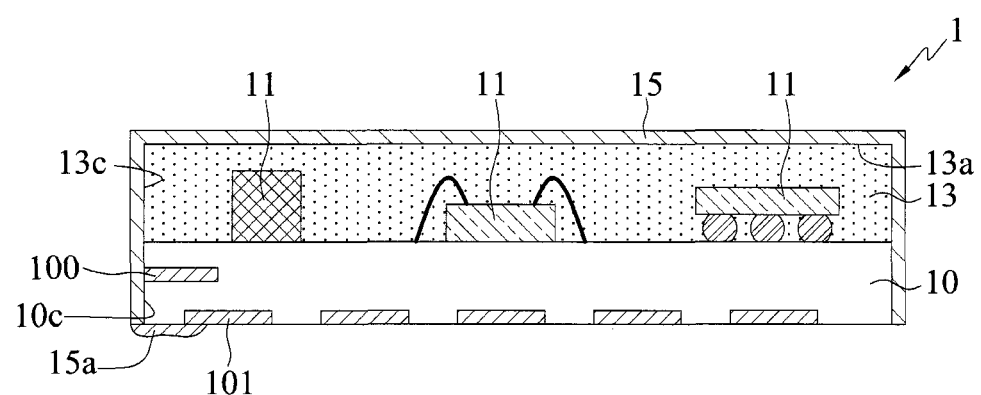
FIG. 1 is a schematic cross-sectional view of a conventional RF module.
Figure 2A:
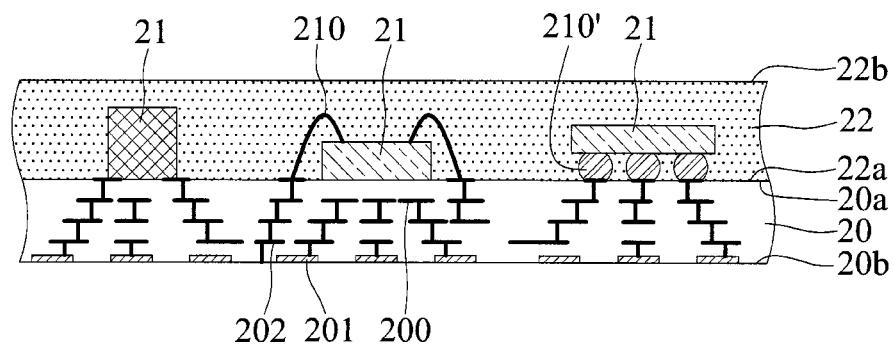
FIGS. 2A to 2D are schematic cross-sectional views showing a method for fabricating an electronic package according to the present disclosure.
Figure 2A:
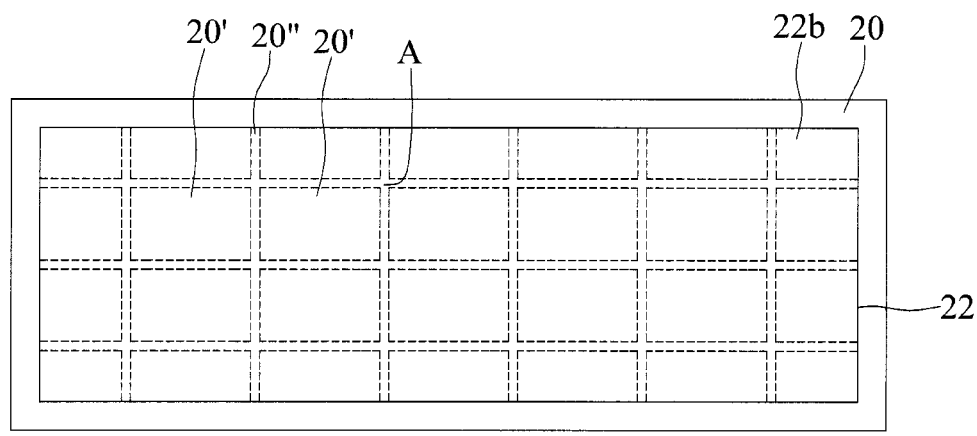

Referring to FIG. 2A, a carrier 20 having a first side 20a and a second side 20b opposite to the first side 20a is provided, and a plurality of electronic components 21 are disposed on the first side 20a of the carrier 20. Then, an encapsulant layer 22 is formed on the first side 20a of the carrier 20 to encapsulate the electronic components 21.

In an embodiment, referring to FIG. 2A', the carrier 20 is of a full-panel type, which has a plurality of substrates 20' arranged in an array and a plurality of isolating portions 20" formed between the substrates 20'. In an embodiment, each of the substrates 20' is a circuit structure having a core layer or a coreless circuit structure, which has a plurality of circuit layers 200 such as fan-out redistribution layers. The substrate 20' is made of a dielectric material, such as polybenzoxazole (PBO), polyimide or prepreg. Alternatively, the substrate 20' can be, for example, an organic board, a wafer, or a board with metal wiring.

The circuit layers 200 have a plurality of grounding portions 202 defined therein and a plurality of conductive pads 201 formed on the second side 20b of the substrate 20.

Any desired number of electronic components 21 can be disposed on the substrate 20'. Each of the electronic components 21 can be an active element such as a semiconductor chip, a passive element, such as a resistor, a capacitor or an inductor, or a combination thereof. In an embodiment, the electronic component 21 is an RF chip, such as a Bluetooth chip, a Wi-Fi chip or the like. In an embodiment, the electronic component 21 has a plurality of electrode pads (not shown) electrically connected to the circuit layers 200 through a plurality of bonding wires 210. In another embodiment, the electronic component 21 is disposed on the carrier 20 in a flip-chip manner and the electrode pads of the electronic component 21 are electrically connected to the circuit layers 200 through a plurality of conductive bumps 210' made of, for example, a solder material. In a further embodiment, the electronic component 21 is directly bonded and electrically connected to the circuit layers 200.

The encapsulant layer 22 has a first surface 22a bonded to the first side 20a of the carrier 20 and a second surface 22b opposite to the first surface 22a. In an embodiment, the encapsulant layer 22 is made of an insulating material, such as polyimide, a dry film, an epoxy resin or a molding compound. The encapsulant layer 22 can be formed on the first side 20a of the carrier 20 by lamination or molding.

Figure 2B:
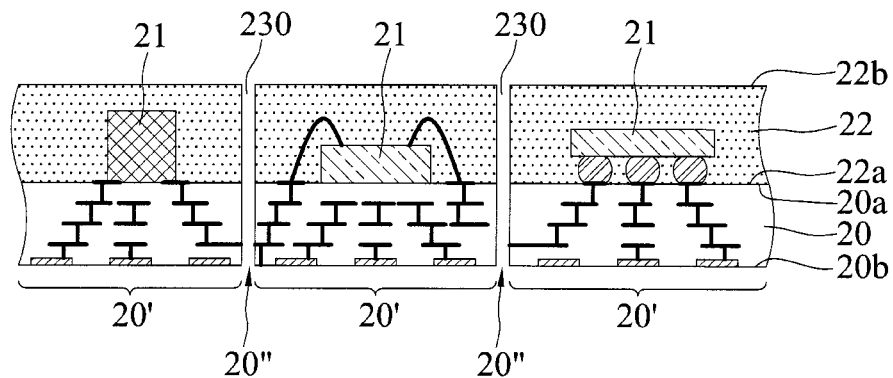
Figure 2B:
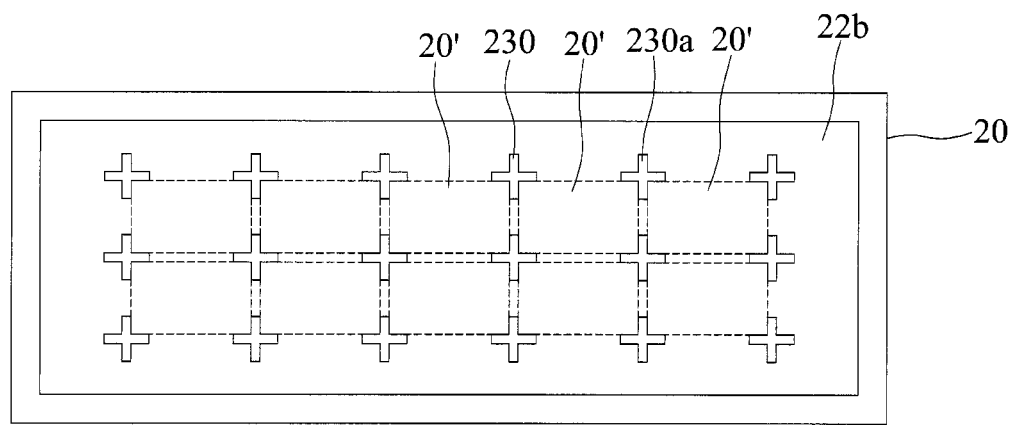

Referring to FIG. 2B, a plurality of through holes 230 are formed in the encapsulant layer 22, and extend to the second side 20b of the carrier 20.

In an embodiment, referring to FIG. 2A', the through holes 230 are formed at intersections A of the isolating portions 20". As such, referring to FIG. 2B', the through holes 230 are positioned at corners of the substrates 20' and have cross-shaped end surfaces 230a.

Figure 2C:
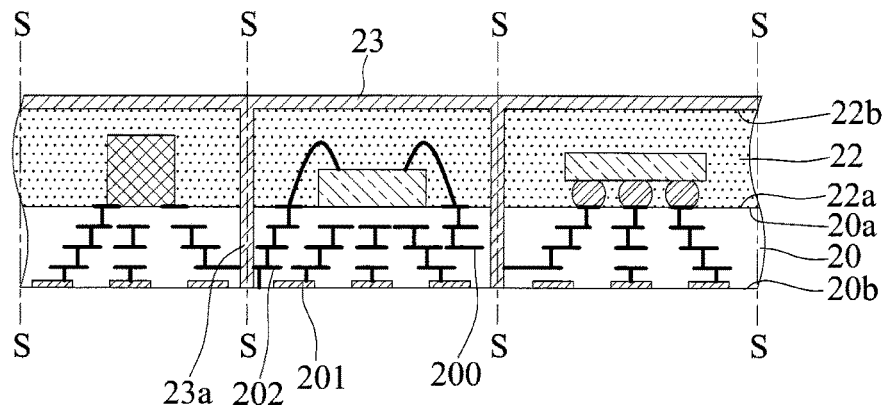

Referring to FIG. 2C, a metal electroplating process is performed to form a shielding layer 23 on the second surface 22b of the encapsulant layer 22. The shielding layer 23 extends into the through holes 230 to serve as extending portions 23a. The extending portions 23a are in contact and electrical connection with the grounding portions 202 of the carrier 20 so as to serve as electromagnetic shields.

In an embodiment, the shielding layer 23 is made of Au, Ag, Cu, Ni, Fe, Al, or stainless steel (SUS).

The shielding layer 23 can be formed by coating, sputtering, chemical plating, electroless plating or evaporation.

It should be noted that the grounding portions 202 can be formed at any desired position as long as the shielding layer 23 is electrically connected to the grounding portions 202.

Figure 2D:
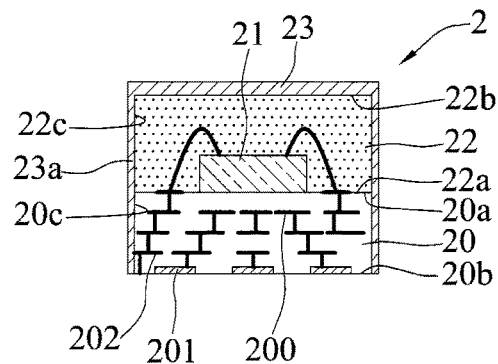
Figure 2D:
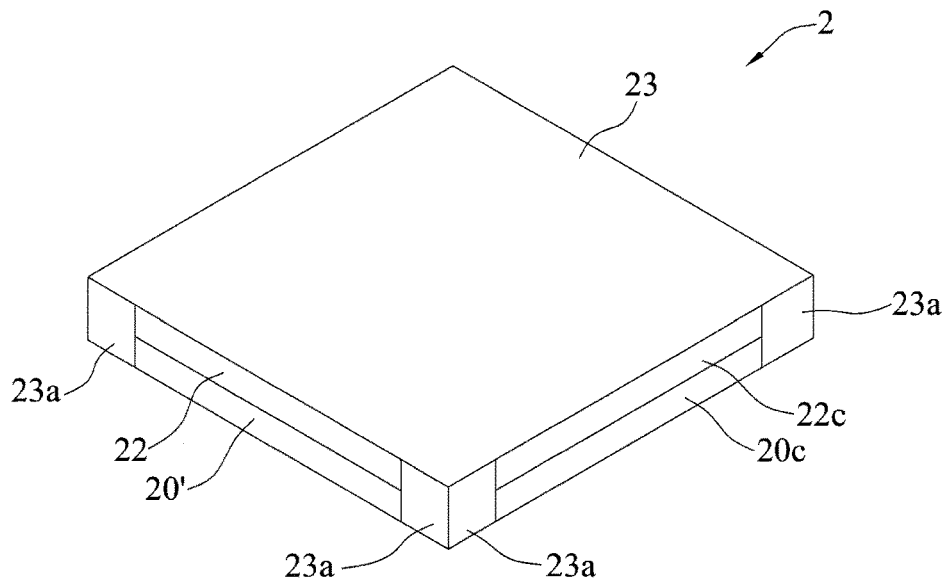

Referring to FIGS. 2D and 2D', a singulation process is performed along cutting paths S of FIG. 2C so as to obtain electronic packages 2. The cutting paths S correspond in position to the isolating portions 20" and pass through the through holes 230. The extending portion 23a extends from a portion of edges (for example, corners) of the second surface 22b of the encapsulant layer 22 to the lateral side 20c of the substrate 20' along the side surface 22c of the encapsulant layer 22, without extending to the second side 20b of the substrate 20', with a portion of the side surface 22c of the encapsulant layer 22 and a portion of the lateral side 20c of the substrate 20' exposed from the shielding layer 23.

In an embodiment, the lateral side 20c of the substrate 20' is adjacent to the first side 20a and the second side 20b, and the side surface 22c of the encapsulant layer 22 is adjacent to the first surface 22a and the second surface 22b.

Further, the grounding portion 202 communicates with the lateral side 20c of the substrate 20' so as to be in contact with the extending portion 23a, and the conductive pads 201 are exposed from the second side 20b of the substrate 20'.

In an embodiment, the extending portion 23a extends from a corner of the second surface 22b of the encapsulant layer 22 toward a corner of the second side 20b of the substrate 20'. The extending portion 23a does not extend to the second side 20b of the substrate 20'. Instead, the extending portion 23a only extends to the intersection of the lateral side 20c and the second side 20b of the substrate 20'.

In addition, in subsequent processes, a plurality of conductive elements (not shown) such as solder balls are disposed on the conductive pads 201 for an external device (not shown), such as a package structure or a circuit board to be mounted thereon.

According to the present disclosure, during the formation of the shielding layer 23, the through holes 230 allow the extending portions 23a of the shielding layer 23 to extend from a corner of the second surface 22b of the encapsulant layer 22 toward a corner of the second side 20b of the substrate 20'. In an embodiment, the extending portion 23a only extends to the intersection of the lateral side 20c and the second side 20b of the substrate 20', without extending to the second side 20b of the substrate 20'. As such, the present disclosure prevents the extending portion 23a from overflowing on the second side 20b of the substrate 20' and coming into contact with the conductive pads 201, thus effectively avoiding a short circuit from occurrence.

Further, the shielding layer 23 that covers an outer periphery of the electronic component 21 protects the electronic component 21 against external EMI during operation of the electronic package 2, thereby improving electrical performance of the electronic package 2.

The present disclosure further provides an electronic package 2, which has: a substrate 20' having a first side 20a, a second side 20b opposite to the first side 20a, and a lateral side 20c adjacent to the first side 20a and the second side 20b; at least one electronic component 21 disposed on the first side 20a of the substrate 20' and electrically connected to the substrate 20'; an encapsulant layer 22 formed on the first side 20a of the substrate 20', encapsulating the electronic component 21, and having a first surface 22a bonded to the first surface 20a of the substrate 20', a second surface 22b opposite to the first surface 22a, and a side surface 22c adjacent to the first surface 22a and the second surface 22b; and a shielding layer 23 formed on the second surface 22b of the encapsulant layer 22 and having an extending portion 23a extending from a portion of an edge of the second surface 22b of the encapsulant layer 22 to the lateral side 20c of the substrate 20' along the side surface 22c of the encapsulant layer 22, without extending to the second side 20b of the substrate 20, with a portion of the side surface 22c of the encapsulant layer 22 and a portion of the lateral side 20c of the substrate 20' exposed from the shielding layer.

In an embodiment, the substrate 20' has a plurality of conductive pads 201 exposed from the second side 20b of the substrate 20'.

In an embodiment, the substrate 20' has a grounding portion 202 in contact with the shielding layer 23. In another embodiment, the grounding portion 202 communicates with the lateral side 20c of the substrate 20' so as to be in contact with the extending portion 23a of the shielding layer 23.

In an embodiment, the encapsulant layer 22 is made of an insulating material.

In an embodiment, the shielding layer 23 is made of a conductive material.

In an embodiment, the extending portion 23a extends from a corner of the second surface 22b of the encapsulant layer 22 toward a corner of the second side 20b of the substrate 20'.

According to the present disclosure, the extending portion of the shielding layer extends from a portion of an edge of the second surface of the encapsulant layer to the lateral side of the substrate along the side surface of the encapsulant layer, without extending to the second side of the substrate, with a portion of the side surface of the encapsulant layer and a portion of the lateral side of the substrate exposed form the shielding layer. As such, the present disclosure prevents the extending portion from coming into contact with the conductive pads of the substrate, thus effectively avoiding a short circuit from occurrence.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A method for fabricating an electronic package, comprising:
   providing a substrate having a first side, a second side opposite to the first side, and a lateral side adjacent to the first side and the second side;
   disposing an electronic component on the first side of the substrate, and electrically connecting the electronic component to the substrate;
   forming on the substrate an encapsulant layer encapsulating the electronic component and having a first surface bonded to the first side of the substrate, a second surface opposite to the first surface, and a side surface adjacent to the first surface and the second surface; and
   forming on the second surface of the encapsulant layer a shielding layer having an extending portion extending from a portion of an edge of the second surface of the encapsulant layer to the lateral side of the substrate along the side surface of the encapsulant layer, the extending portion being free from extending to the second side of the substrate, with a portion of the side surface of the encapsulant layer and a portion of the lateral side of the substrate exposed from the shielding layer, wherein the substrate has a grounding portion in contact with the shielding layer, the grounding portion communicates with the lateral side of the substrate and is in contact with the extending portion of the shielding layer, wherein the extending portion extends from a corner of the second surface of the encapsulant layer toward a corner of the second side of the substrate.

2. The method of claim 1, wherein the substrate has a plurality of conductive pads exposed from the second side of the substrate.

3. The method of claim 1, wherein the encapsulant layer is made of an insulating material.

4. The method of claim 1, wherein the shielding layer is made of a conductive material.

5. A method of forming the shielding layer according to claim 1, comprising:
   providing a carrier having a plurality of substrates and a plurality of isolating portions formed between the substrates;
   disposing a plurality of electronic components on the substrates, with an encapsulant layer encapsulating the electronic components, the encapsulant layer having a first surface bonded to the first side of the substrate, a second surface opposite to the first surface, and a side surface adjacent to the first surface and the second surface;
   forming in the encapsulant layer a plurality of through holes extending to lateral surfaces of the substrates and corresponding in position to the isolating portions at corners of the substrates;
   forming the shielding layer on the second surface of the encapsulant layer, with the shielding layer extending in the through holes to form extending portions; and
   performing a singulation process along the isolating portions to separate the substrates from one another.

* * * * *